US009673329B2

(12) United States Patent
Morand et al.

(10) Patent No.: US 9,673,329 B2
(45) Date of Patent: Jun. 6, 2017

(54) METHOD FOR MANUFACTURING A FIN MOS TRANSISTOR

(71) Applicants: STMicroelectronics SA, Montrouge (FR); Commissariat A L'Energie Atomique et aux Energies Alternatives, Paris (FR)

(72) Inventors: Yves Morand, Grenoble (FR); Romain Wacquez, Marseilles (FR); Laurent Grenouillet, Albany, NY (US); Yannick Le Tiec, Crolles (FR); Maud Vinet, Rives (FR)

(73) Assignees: STMicroelectronics SA, Montrouge (FR); Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 14/959,430

(22) Filed: Dec. 4, 2015

(65) Prior Publication Data
US 2016/0087092 A1    Mar. 24, 2016

Related U.S. Application Data

(62) Division of application No. 14/193,833, filed on Feb. 28, 2014, now Pat. No. 9,236,478.

(30) Foreign Application Priority Data

Mar. 1, 2013  (FR) ...................... 13 51827

(51) Int. Cl.
*H01L 29/06* (2006.01)
*H01L 29/66* (2006.01)
*H01L 29/78* (2006.01)

(52) U.S. Cl.
CPC ........ *H01L 29/785* (2013.01); *H01L 29/0649* (2013.01); *H01L 29/0657* (2013.01); *H01L 29/66795* (2013.01)

(58) Field of Classification Search
CPC ......... H01L 27/1211; H01L 21/823431; H01L 21/823821; H01L 21/845; H01L 27/0886; H01L 27/0924; H01L 29/41791; H01L 29/66795–29/66818; H01L 29/785–29/7856; H01L 2924/13067
See application file for complete search history.

(56) References Cited

U.S. PATENT DOCUMENTS 6,800,885 B1    10/2004  An et al.
9,263,345 B2 *   2/2016  Goto .................. H01L 21/84
2002/0146915 A1  10/2002  Narwankar et al.
(Continued)

OTHER PUBLICATIONS

INPI Search Report for FR 1351827 dated Dec. 12, 2013 (7 pages).

*Primary Examiner* — Kevin Parendo
(74) *Attorney, Agent, or Firm* — Gardere Wynne Sewell LLP

(57) ABSTRACT

A fin MOS transistor is made from an SOI-type structure that includes a semiconductor layer on a silicon oxide layer coating a semiconductor support. A trench formed from the surface of the semiconductor layer delimits at least one fin in the semiconductor layer, that trench extending at least to an upper surface of the semiconductor support. Etched recesses in sides of a portion of the silicon oxide layer located under the fin are filled with a material selectively etchable over silicon oxide.

12 Claims, 3 Drawing Sheets

(56) References Cited

U.S. PATENT DOCUMENTS

| | | |
|---|---|---|
| 2004/0198003 A1 | 10/2004 | Yeo et al. |
| 2004/0262688 A1 | 12/2004 | Nowak et al. |
| 2005/0093074 A1 | 5/2005 | Anderson et al. |
| 2007/0108537 A1 | 5/2007 | Anderson et al. |
| 2007/0252198 A1 | 11/2007 | Chung et al. |
| 2009/0101977 A1 | 4/2009 | Iwamatsu et al. |
| 2009/0256207 A1 | 10/2009 | Chen et al. |
| 2011/0024840 A1* | 2/2011 | Khater ............... H01L 29/66628 257/347 |
| 2011/0298050 A1 | 12/2011 | Luo et al. |
| 2013/0256835 A1* | 10/2013 | Di Sarro ................ H01L 28/90 257/532 |
| 2014/0284760 A1* | 9/2014 | Cheng .................... H01L 21/84 257/528 |

* cited by examiner

METHOD FOR MANUFACTURING A FIN MOS TRANSISTOR

CROSS REFERENCE TO RELATED APPLICATIONS

This application is a divisional application from U.S. application for patent Ser. No. 14/193,833 filed Feb. 28, 2014, which claims the priority benefit of French Patent Application No. 1351827, filed Mar. 1, 2013, the disclosures of which are hereby incorporated by reference to the maximum extent allowable by law.

TECHNICAL FIELD

The present disclosure relates to semiconductor manufacturing techniques. It more specifically aims at a method for manufacturing a MOS transistor, and at a transistor obtained by this method.

BACKGROUND

Some MOS transistors have an active portion comprising a semiconductor fin laid on a support, an insulated conductive gate located on two or three sides of the fin enabling, according to the biasing state of the transistor, to set it to an on or off state. Such a transistor is sometimes called finFET ("fin Field Effect Transistor") in the art. In the present disclosure, transistors of this type are called fin transistors.

It has especially been provided to form a fin transistor based on an SOI-type ("semiconductor on insulator") structure comprising a semiconductor layer on a silicon oxide layer coating a semiconductor support. The fin is then formed in the semiconductor layer of the SOI structure.

In practice, the manufacturing of fin MOS transistors on an SOI structure raises technical issues.

SUMMARY

Thus, an embodiment provides a method for manufacturing a fin MOS transistor from an SOI-type structure comprising a semiconductor layer on a silicon oxide layer coating a semiconductor support, this method comprising the steps of: a) forming, from the surface of the semiconductor layer, at least one trench delimiting at least one fin in the semiconductor layer and extending all the way to the surface of the semiconductor support; b) etching the sides of a portion of the silicon oxide layer located under the fin to form at least one recess under the fin; and c) filling the recess with a material selectively etchable over silicon oxide.

According to an embodiment, the material has a greater dielectric constant than silicon oxide.

According to an embodiment, the material is a nitride.

According to an embodiment, the method further comprises the step of continuing the trench all the way to an intermediate level of the support.

According to an embodiment, the method further comprises the step of coating with a nitride layer the sides, accessible from the trench, of the portion of the support located under the fin.

According to an embodiment, the method further comprises, before the coating step, a step of forming, from the trench, a recess in the portion of the support located under the fin.

According to an embodiment, the method further comprises, before the coating step, a step of deposition of a silicon oxide layer on the sides.

According to an embodiment, the method further comprises the step of filling the trench with silicon oxide.

According to an embodiment, the method further comprises a step during which the sides and the upper surface of the fin are exposed.

According to an embodiment, the method further comprises the step of forming a gate stack coating the sides and the upper surface of the fin.

Another embodiment provides a MOS transistor formed from an SOI-type structure comprising a semiconductor layer on a silicon oxide layer coating a semiconductor substrate, this transistor comprising: at least one fin delimited by at least one trench formed from the surface of the semiconductor layer; and at least one region made of a material selectively etchable over silicon oxide, located in a recess formed in a portion of the silicon oxide layer located under the fin.

Another embodiment provides a MOS transistor arranged inside and/or on top of a semiconductor substrate, comprising: at least one semiconductor fin arranged on the support and separated from the support by a portion of a silicon oxide layer; and at least one region of a material selectively etchable over silicon oxide, located in a recess located under the fin, between the fin, the support, and the silicon oxide layer portion.

According to an embodiment, the transistor comprises a control electrode connected to a portion of the support located under the fin.

In an embodiment, a transistor comprises: an SOI-type structure including a semiconductor layer on a silicon oxide layer coating a semiconductor support; a fin structure formed by a portion of the semiconductor layer, a portion of the silicon oxide layer and a portion of the semiconductor support, said fin structure delimited by a trench on each side of the fin structure, said trench extending from a top of the semiconductor layer to an intermediate level of said semiconductor support; and at least one region made of a material selectively etchable over silicon oxide, located in a recess of same thickness as oxide layer formed on a side surface of the portion of the silicon oxide layer located under the portion of the semiconductor layer.

In an embodiment, a transistor comprises: a semiconductor support having a top surface and a trench extending at least from the top surface to an intermediate level which delimits a semiconductor region; an insulating oxide support arranged on the top surface of the semiconductor support and having a width which is less than a width of the semiconductor support; a semiconductor fin arranged on a top surface of the insulating oxide support and having a width which is more than the width of the insulating oxide support such that a recess is provided on each side of the insulating oxide support below the semiconductor fin and above the semiconductor region; and a dielectric material selectively etchable over oxide that is located in said recess.

BRIEF DESCRIPTION OF THE DRAWINGS

The foregoing and other features and advantages will be discussed in detail in the following non-limiting description of specific embodiments in connection with the accompanying drawings, wherein.

For clarity, the same elements have been designated with the same reference numerals in the different drawings and, further, as usual in the representation of integrated circuits, the various drawings are not to scale.

DETAILED DESCRIPTION

Figure 1:
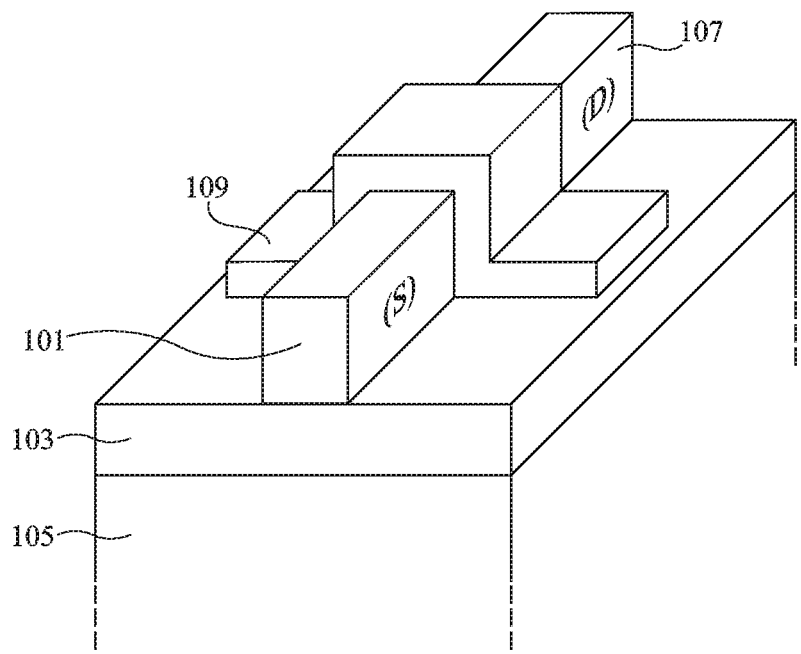
FIG. 1 is a perspective view schematically showing an example of fin MOS transistor.

The transistors described hereafter are formed from an SOI-type structure comprising a semiconductor layer 101 on a silicon oxide layer 103 coating a semiconductor support 105. In the rest of the present description, terms "top", "bottom", "high", "low", "upper", and "lower" are defined with respect to a vertical axis when the SOI structure is positioned so that the surface of semiconductor support 105 opposite to silicon oxide layer 103 is in an approximately horizontal plane and faces downwards, as shown in the drawings.

FIG. 1 is a perspective view schematically showing an example of a fin MOS transistor formed from an SOI structure. Trenches etched from the upper surface of layer 101 and extending in depth all the way to the upper surface of silicon oxide layer 103 define a semiconductor fin 107 formed in layer 101. The lower surface of fin 107 is supported by silicon oxide layer 103. A gate stack 109, for example comprising a dielectric layer coated with a conductive layer (not differentiated in the drawings), is formed on the three free surfaces of at least one section of the fin, that is, its lateral surfaces and its upper surface. Fin section 107 partially surrounded with gate 109 forms a channel-forming region of the transistor. On either side of gate 109 are located portions of layer 101 respectively forming a source region (S) and a drain region (D) of the transistor.

In a fin transistor of the type described in relation with FIG. 1, the greater number of sides on which gate 109 controls the transistor channel enables to better control the transistor than in planar MOS transistors. This enables to form transistors of smaller dimensions than planar MOS transistors or, for identical critical dimensions, to form transistors having lower short-channel effects and capable of supporting, in the on state, higher currents than planar MOS transistors.

An advantage of fin transistors formed on an SOI structure is that their electric properties (for example, their threshold voltage) can, due to the coupling which exists between semiconductor support 105 and the active portion of the transistor, be modulated by the voltage applied to semiconductor support 105. To take the best advantage of the coupling with support 105, the thickness of silicon oxide layer 103 should however be low, for example, lower than 25 nm and preferably lower than 15 nm, which may result in technical difficulties on manufacturing of the transistor.

On manufacturing of the transistor of FIG. 1, several successive etch and cleaning steps may be provided, especially to form fin 107 in layer 101, and then, subsequently, to define gate stack 109.

To improve this device, it is desired to avoid for these etching and cleaning operations to cause an unwanted consumption of silicon oxide layer 103 at the level of the etched surfaces. When layer 103 of the initial SOI structure is very thin, short-circuits may occur between the active portion of the transistor and support 105, thus making the transistor useless.

Independently from the thickness of layer 103 and from short-circuit phenomena between the active portion and support 105, the etching and cleaning operations which come before the deposition of gate stack 109 may cause a consumption of layer 103 under the edges of fin 107, thus creating a cavity or a recess under the fin periphery. Such a cavity may be at least partly filled with gate stack 109. This poses a problem of definition of the transistor conduction width. Indeed, the consumption of layer 103 under fin 107 is relatively poorly controlled and may induce a variability of the conduction width from one transistor to another, which is not desirable.

An object of the described embodiments is to improve the device of FIG. 1.

FIGS. 2A to 2J are cross-section views schematically illustrating steps of an example of a method for manufacturing a fin MOS transistor from an SOI structure.

Figure 2A:
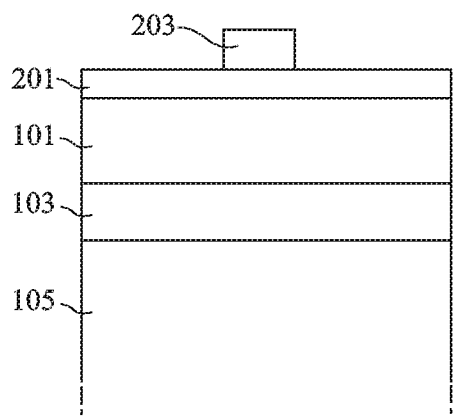
FIGS. 2A to 2J are cross-section views schematically illustrating steps of an embodiment of a method for manufacturing a fin MOS transistor.

FIG. 2A illustrates the initial SOI structure. Semiconductor layer 101 is, for example, made of silicon or of silicon-germanium, and support 105 is for example made of silicon. Other semiconductor material may be used to form layer 101 and support 105. As an example, silicon oxide layer 103 has a relatively low thickness, for example, ranging between 5 and 15 nm, and semiconductor layer 101 has a thickness ranging between 10 and 25 nm. A silicon nitride layer 201 is deposited on semiconductor layer 101. A thin interface layer, not shown, for example, made of silicon oxide, may be provided between layer 101 and layer 201. An etch mask 203, for example, made of resin, is formed on nitride layer 201. Mask 203 has, in top view, the shape of the semiconductor portion of the transistor which is desired to be formed and, in particular, a portion of mask 203 has, in top view, the shape of a fin which is desired to be formed in semiconductor layer 101.

Figure 2B:
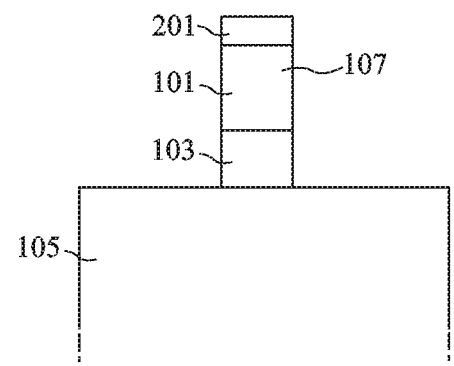

FIG. 2B illustrates a step subsequent to the forming of mask 203, during which the portions of layers 201, 101, and 103 unprotected by mask 203 are removed by etching from the upper surface of the structure, which amounts to forming a trench defining, in layer 101, the active portion of the transistor and in particular a semiconductor fin 107. The trench delimiting the active portion of the transistor extends in depth all the way to the upper surface of semiconductor support 105. An advantage that will appear more clearly when reading the rest of the present description is that this allows realizing a device more resistant to short-circuits between the active portion of the transistor and support 105 than prior art devices.

Fin 107, for example, has a thickness ranging between 10 and 30 nm.

Figure 2C:
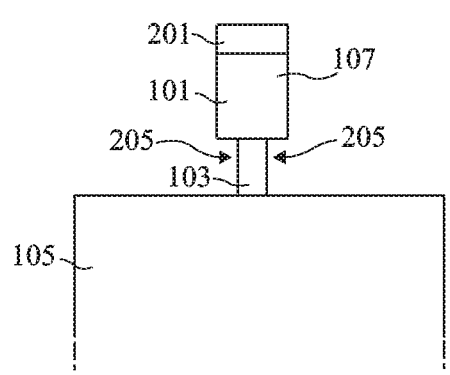

FIG. 2C illustrates a step subsequent to the step of etching of layers 201, 101, and 103, during which the portion of silicon oxide layer 103 located under the active portion of the transistor, and in particular under fin 107, is laterally etched from its sides. A recess 205 of same thickness as oxide layer 103 is thus created under a peripheral region of the active portion of the transistor. It should be noted that during the lateral etch step of FIG. 2C, a portion only of the silicon oxide layer located under fin 107 is removed, layer portion 103 located under the central portion of fin 107 being maintained.

Figure 2D:
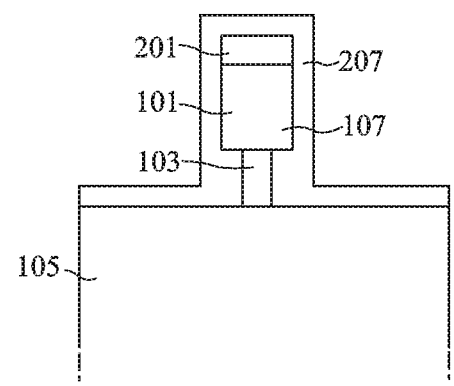

FIG. 2D illustrates a step subsequent to the forming of recess 205, during which a conformal deposition of a layer 207 of a material capable of being selectively etched over silicon oxide is performed. More specifically, according to a first aspect, to form layer 207, a material having a better resistance than silicon oxide to the various etch and cleaning steps provided in the manufacturing of a fin MOS transistor is selected. According to another aspect, layer 207 is preferably made of a material having a greater dielectric constant than silicon oxide. Layer 207 is preferably made of nitride, for example, of silicon nitride or of boron nitride. Other materials having both a greater dielectric constant than silicon oxide and a good resistance to cleaning operations may be used, for example, hafnium oxide or zirconium oxide. As can be seen in FIG. 2D, the thickness of layer 207 is selected so that layer 207 fills recess 205 created during the step of lateral etching of FIG. 2C. As an example, recess 205 may have a thickness on the order of 5 nm, and layer 207 may have a thickness of the same order of magnitude.

Figure 2E:
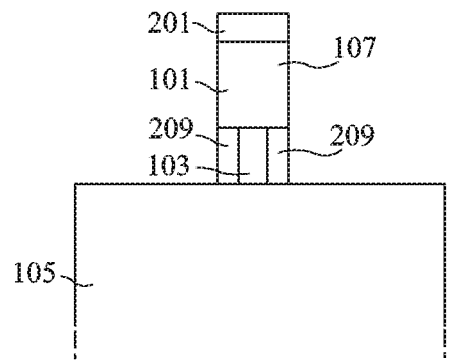

FIG. 2E illustrates a step subsequent to the deposition of layer 207, during which layer 207 is etched to only keep of this layer a region 209 located under the periphery of the active portion of the transistor, and filling peripheral recess 205 formed during the etching step of FIG. 2C. Region 209 thus replaces silicon oxide layer portion 103 etched under the active portion of the transistor during the etching step of FIG. 2C. It should be noted that the fact of maintaining, during the etching step of FIG. 2C, a layer portion 103 under the central portion of fin 107 enables to avoid a collapse, even partial, of fin 107, to provide for region 209 to have exactly the same height as layer 103. As an example, the etching of layer 207 may comprise a first anisotropic dry etch step enabling to remove most of layer 207 except for region 209 and a portion of the thickness of layer 207 coating the sides of the fin, followed by a second wet etch step, for example, with hydrofluoric acid and ethylene glycol, enabling to remove well from the sides of fin 107 possible residues of layer 207. As a variation, a single isotropic etch step may be implemented to etch layer 207.

Figure 2F:
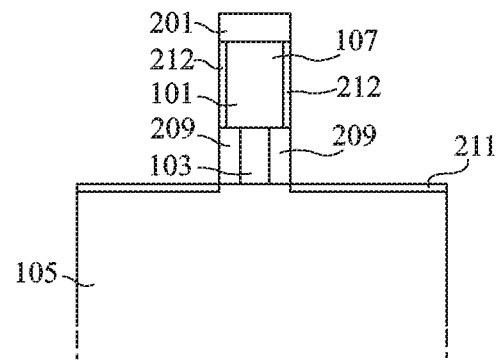

FIG. 2F illustrates an optional step of oxidation of the semiconductor surfaces left exposed at the end of the etch step of FIG. 2E. During this step, an oxide layer 211 forms on the surface of support 105 surrounding, in top view, the active portion of the transistor, and an oxide layer 212 forms on the sides of the active portion of the transistor, and in particular on the sides of fin 107.

Figure 2G:
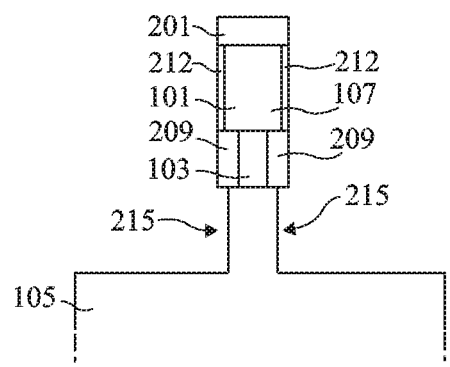

FIG. 2G illustrates a step of anisotropic etching, from the upper surface of the structure, of oxide layer 211 and of a portion of semiconductor support 105 surrounding, in top view, the active portion of the transistor. This amounts to vertically continuing, all the way to an intermediate level of support 105, the trench formed at the etch step of FIG. 2B, which delimits the active portion of the transistor. As an example, from 10 to 200 nm of the thickness of support 105 may be removed around the active portion of the transistor and in particular around fin 107 during this step. Nitride layer 201 covering the active portion of the transistor is used as a hard mask for the etching. After the step of anisotropic etching of support 105, a step of isotropic etching of support 105 may be provided to create a slight recess 215, for example, with a width ranging from 1 to 5 nm, in the portion of support 105 located under region 209. During this isotropic etch step, oxide layer 212 protects the sides of the active portion of the transistor.

Figure 2H:
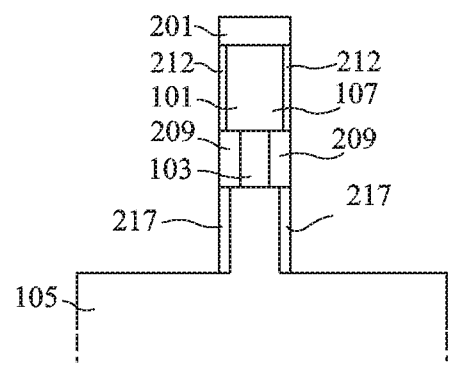

FIG. 2H illustrates the forming of a nitride coating 217 on the sides, made accessible during the etch steps of FIG. 2G, of the upper portion of support 105 located under the active region of the transistor. In the shown example, coating 217 fills recess 215 created at the end of the isotropic etch step of FIG. 2G. As an example, to form coating 217, a conformal deposition of nitride over the entire surface of the structure may be performed, and followed by an anisotropic etching to remove the nitride layer except for the portion of this layer located in recess 215.

Figure 2I:
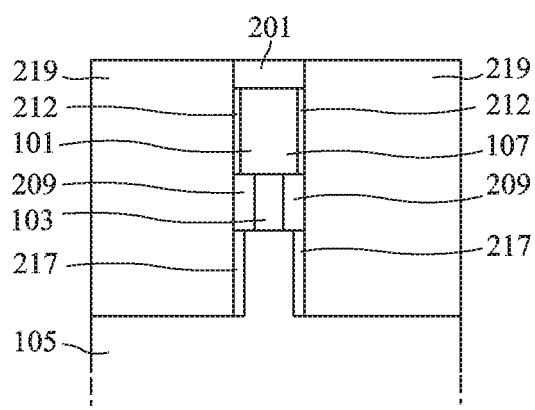

FIG. 2I illustrates a step subsequent to the forming of nitride coating 217, during which the cavity or trench surrounding the active portion of the transistor and in particular fin 107 is totally filled with silicon oxide 219. As an example, to perform this filling, silicon oxide is deposited over the entire structure up to a height greater than that of nitride layer 201, after which a chemical-mechanical planarization step stopping on nitride layer 201 is implemented to remove the excess silicon oxide.

During a step, not shown, subsequent to the forming of silicon oxide region 219, nitride layer 201 is removed, for example, by etching with hot orthophosphoric acid.

After the removal of nitride layer 201, an upper portion of silicon oxide region 219 surrounding the active portion of the transistor, as well as oxide layer 212 coating the sides of the active portion of the transistor, are removed by etching to fully expose the sides of the active portion of the transistor, and in particular of fin 107. As an example, the etching of silicon oxide 219 is stopped at an intermediate level between the upper surface and the lower surface of region 209 (and thus of silicon oxide layer 103 having region 209 vertically aligned thereon).

Figure 2J:
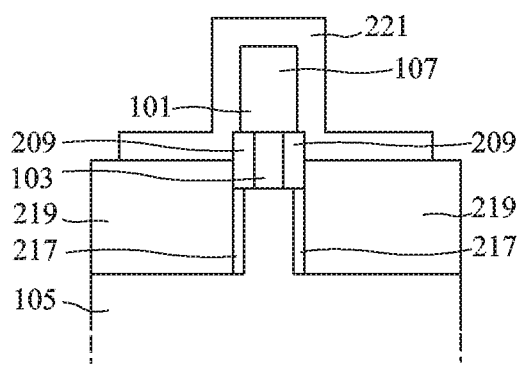

FIG. 2J illustrates a step subsequent to the etching of oxide regions 212 and 219, during which a gate stack 221 coating the upper surface and the sides of fin 107 is formed.

Figure 3A:
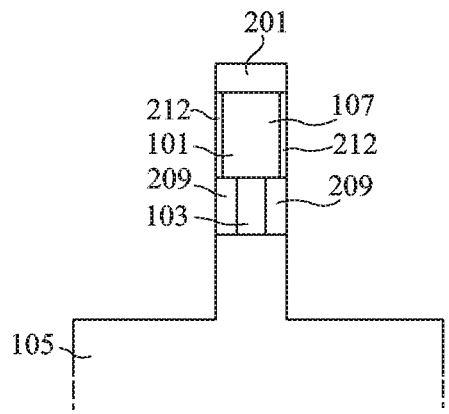
FIGS. 3A to 3E are cross-section views schematically illustrating steps of an alternative embodiment of the method of FIGS. 2A to 2J.
Figure 3B:
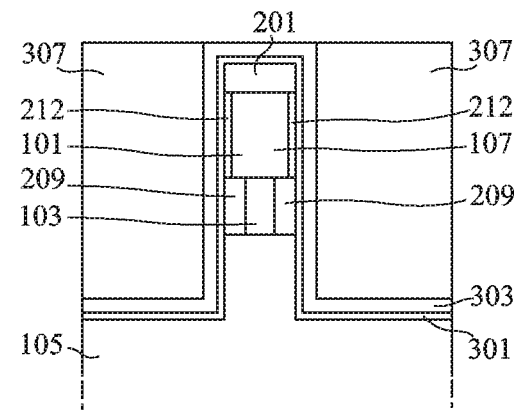
Figure 3C:
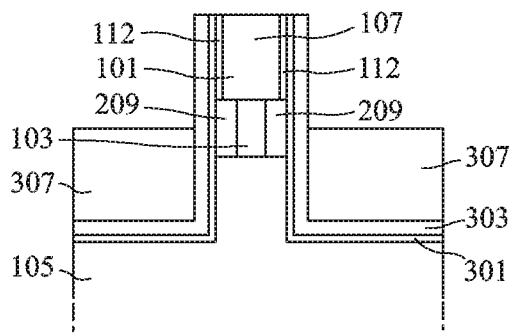
Figure 3D:
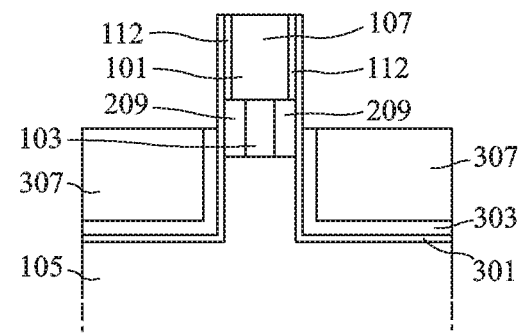
Figure 3E:
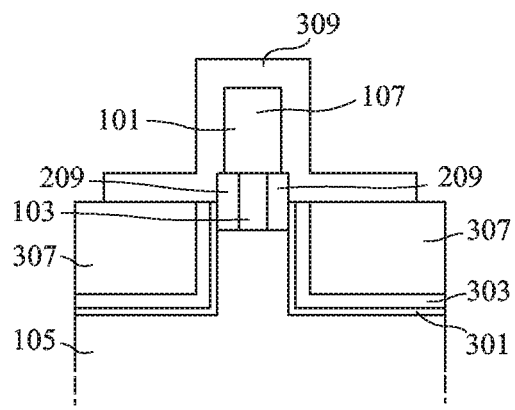

FIGS. 3A and 3E are cross-section views schematically illustrating steps of an example of an alternative embodiment of the method for manufacturing a fin transistor described in relation with FIGS. 2A to 2J.

The initial steps of the method of prior to the steps shown in FIGS. 3A to 3E are identical or similar to those of the method of FIGS. 2A to 2J. In particular, in this example, the steps of FIGS. 2A to 2F are common to the two methods and have thus not been shown in FIGS. 3A to 3E.

FIG. 3A illustrates a step subsequent to the oxidation step of FIG. 2F, during which an anisotropic etching of oxide layer 211 and of an upper portion of semiconductor support 105 is carried out. This anisotropic etching is identical or similar to the anisotropic etching step of FIG. 2G. A difference with the method of FIGS. 2A to 2J is that the method of FIGS. 3A to 3E does not comprise the isotropic etching step of FIG. 2G, forming a peripheral recess 215 (FIG. 2G) in support 105 under the active portion of the transistor.

FIG. 3B illustrates a step subsequent to the anisotropic step of FIG. 3A, during which a first conformal deposition of a silicon oxide layer 301 is performed, for example by a thickness ranging from 2 to 5 nm, followed by a second conformal deposition of a nitride layer 303, for example by a thickness ranging from 3 to 10 nm. After the deposition of layer 303, the cavity or trench surrounding the active portion of the transistor is entirely filled with silicon oxide 307. As an example, to perform this filling, silicon oxide is deposited over the entire structure all the way to a height greater than that of the upper portion of nitride layer 303 topping the upper surface of layer 201, after which a step of chemical-mechanical polishing planarization, stopping on the upper portion of nitride layer 303 topping the upper surface of layer 201, is implemented to remove the excess silicon oxide.

During a step, not shown, subsequent to the forming of silicon oxide region 307, the upper portions of oxide and nitride layers 301 and 303 topping nitride layer 201, as well as nitride layer 201, are removed, for example by etching with hydrofluoric acid, ethylene glycol, and phosphoric acid.

FIG. 3C illustrates a step subsequent to the removal of nitride layer 201, during which an upper portion of silicon oxide region 307 surrounding the active portion of the transistor is removed by etching, all the way to a level lower than the lower surface of semiconductor layer 101, for example, all the way to an intermediate level between the upper surface and the lower surface of region 209.

FIG. 3D illustrates a step subsequent to the etch step of FIG. 3C, during which the portion of nitride layer 303 located on the sides of the active portion of the transistor is removed, for example, by etching with phosphoric acid.

During a step, not shown, subsequent to the etch step of FIG. 3D, the portion of oxide layer 301 located on the sides of the active portion of the transistor, as well as oxide layer 212, are removed by etching, to totally expose the sides of the active portion of the transistor and in particular of fin 107.

FIG. 3E illustrates a step subsequent to the removal of oxide layer 212, during which a gate stack 309 coating the upper surface and the sides of fin 107 is formed.

An advantage of the embodiments described in relation with FIGS. 2A to 2J and 3A to 3E is that they enable to avoid risk of short-circuit with semiconductor support 105, and this, even when silicon oxide layer 103 of the initial SOI structure is very thin, for example, when it has a thickness smaller than 25 nm. Indeed, under the active portion of the transistor, region 209 made of a material resistant to the various etch and cleaning steps prevents any risk of short-circuit with support 105 and, around the active portion of the transistor, the trench filled with oxide 219 or 307 prevents risks of short-circuit with support 105. Nitride coating 217 (in the embodiment of FIGS. 2A to 2J) and nitride layer 303 (in the embodiment of FIGS. 3A to 3E) further enhance the protection against risks of short-circuit with support 105 around the sides of the active portion of the transistor.

Another advantage of the embodiments described in relation with FIGS. 2A to 2J and 3A to 3E is that they enable, due to regions 209, to avoid problems of variability of the conduction width of the transistor resulting from the consumption of layer 103 under the active portion of the transistor, and in particular under fin 107. Indeed, region 209 being made of a material resistant to the various etch and cleaning solutions used on manufacturing of the transistor, there is no unwanted consumption of region 209 under the fin edges.

Another advantage of the embodiments described in relation with FIGS. 2A to 2J and 3A to 3E is that for a given thickness of silicon oxide layer 103 of the initial SOI structure, they enable, in the case where region 209 is made of a material of greater dielectric constant than silicon oxide, to improve the coupling with support 105 with respect to a transistor of the type described in relation with FIG. 1.

In the case where the upper semiconductor layer of the initial SOI structure is a silicon-germanium layer, it may be advantageous, after having exposed the upper and lateral surfaces of fin 107 and before the deposition of the gate stack, to implement a step of germanium condensation by thermal oxidation, to obtain a higher germanium concentration on the three faces of the fin intended to be in contact with the gate.

Specific embodiments have been described. Various alterations, modifications, and improvements will readily occur to those skilled in the art.

In particular, the described embodiments are not limited to the numerical examples of thickness mentioned in the present disclosure.

Further, although the described embodiments are particularly advantageous to form fin MOS transistors from SOI structures where the buried silicon oxide layer is very thin, they are not limited to this specific case and are also compatible with SOI structures with a thick silicon oxide layer, for example, of a thickness ranging from several tens to several hundreds of nanometers.

Further, for simplification, MOS transistors comprising a single fin between a source region and a drain region have been shown in the drawings. The described embodiment are not limited to this specific case and are compatible with transistors comprising several parallel fins between a source region and a drain region.

Further, in the examples shown in the drawings, the gate stack enables to control three surfaces of the transistor fin. The described embodiments are not limited to this specific case. As a variation, a fin transistor where only the lateral surfaces of the fin are controlled by the gate may be formed. To achieve this, it may, for example, be provided to interpose an additional insulating thickness between the upper surface of the fin and the gate stack, to deactivate the control of the upper surface of the fin by the gate.

Further, although this has not been shown in the drawings, an additional step of implantation of dopant elements in the region of support 105 located under fin 107 may optionally be provided, to increase the coupling between the substrate and the active portion of the transistor. This implantation step is preferably carried out after the deposition of layer 207 (FIG. 2D), by using all or part of layer 207 to avoid for dopant elements to be implanted in the channel region of the transistor.

Whether an implantation of dopant elements is provided or not in the region of support 105 located under fin 107, a control electrode, not shown in the drawings, may be connected to the region of support 105 located under fin 107.

As an example, the implantation of dopant elements in the region of support 105 located under fin 107 may be performed from the upper surface of the structure, just after the deposition of layer 207, with a substantially vertical implantation orientation. The implantation energy is preferably selected to be sufficiently high to cross layer 207 widthwise, and sufficiently low so as not to cross upper nitride cap 201. The channel region of the transistor is then protected from the implantation by upper nitride cap 201 on the one hand, and by the portion of layer 207 covering the sides of fin 107 on the other hand. An anneal (for example, at a temperature on the order of 1,050° C. for approximately 5 seconds) may optionally be provided to promote the diffusion of the dopant elements under the entire surface of the channel region of the transistor.

As a variation, the implantation may be performed with a slight angle with respect to the vertical direction, which allows a better penetration of dopant elements under the entire surface of the transistor channel region. The implantation angle is, however, preferably selected to be sufficiently close to the vertical direction to avoid as much as possible the implantation of dopant elements in the transistor channel region at the level of the sides of fin 107.

As a variation, when the step of etching layer 207 of FIG. 2E comprises a first anisotropic etch step to remove most of layer 207 except for region 209 and layer portion 207 coating the sides of fin 107, followed by a second isotropic etching step to remove the portion of layer 207 located under the sides of the fin, it may be provided to perform the implantation of support 105 between these two etching steps. The implantation energy may then be decreased with respect to the above-mentioned variations, since the upper surface of support 105 around fin 107 is no longer coated with layer 207. The channel region of the transistor remains protected from the implantation by nitride cap 201 and by a portion of layer 207 covering the sides of the fin.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A transistor, comprising:
    an SOI-type structure including a semiconductor layer on a silicon oxide layer coating a semiconductor support;
    a fin structure formed by a portion of the semiconductor layer, a portion of the silicon oxide layer and a portion of the semiconductor support, said fin structure delimited by a trench on each side of the fin structure, said trench extending from a top of the semiconductor layer to an intermediate level of said semiconductor support;
    at least one region made of a material selectively etchable over the silicon oxide layer, said at least one region located in a recess of a same thickness as a thickness of the portion of the silicon oxide layer, wherein said recess is located on a side of the portion of the silicon oxide layer and under the portion of the semiconductor layer; and
    a control electrode stack extending over the portion of the semiconductor layer and in contact with the at least one region made of the material selectively etchable over the silicon oxide layer.

2. The transistor of claim 1, further comprising at least one region made of a nitride material formed on a side of the portion of the semiconductor support.

3. The transistor of claim 2, wherein the at least one region made of the nitride material is positioned under the at least one region made of the material selectively etchable over the silicon oxide layer.

4. The transistor of claim 2, wherein the at least one region made of the nitride material extends along a side of the at least one region made of the material selectively etchable over the silicon oxide layer.

5. The transistor of claim 4, further comprising an oxide layer positioned between the at least one region made of the nitride material and the at least one region made of the material selectively etchable over the silicon oxide layer.

6. A transistor, comprising:
    a semiconductor support having a top surface and a trench extending at least from the top surface to an intermediate level of the semiconductor support, the trench delimiting a semiconductor region;
    an insulating oxide support arranged on the top surface of the semiconductor support and having a width which is less than a width of the semiconductor support;
    a semiconductor fin arranged on a top surface of the insulating oxide support and having a width which is more than the width of the insulating oxide support such that a recess is provided on each side of the insulating oxide support below the semiconductor fin and above the semiconductor region;
    a dielectric material selectively etchable over the insulating oxide support and that is located in said recess; and
    a control electrode stack extending over the semiconductor fin and in contact with the dielectric material selectively etchable over the insulating oxide support that is located in said recess.

7. The transistor of claim 6, wherein a combined width of the dielectric material on each side of the insulating oxide support and the insulating oxide support itself is greater than the width of the semiconductor region and greater than the width of the semiconductor fin.

8. The transistor of claim 6, further comprising at least one region made of a nitride material formed on a side surface of the semiconductor region.

9. The transistor of claim 8, wherein the at least one region made of the nitride material is positioned between the dielectric material selectively etchable over the insulating oxide support that is located in said recess and the intermediate level.

10. The transistor of claim 8, wherein the at least one region made of the nitride material extends along a side surface of the dielectric material selectively etchable over the insulating oxide support that is located in said recess.

11. The transistor of claim 10, further comprising an oxide layer positioned between the at least one region made of the nitride material and the dielectric material selectively etchable over the insulating oxide support that is located in said recess.

12. The transistor of claim 6, wherein a combined width of the dielectric material on each side of the insulating oxide support and the insulating oxide support itself is equal to the width of the semiconductor region and greater than the width of the semiconductor fin.

* * * * *